United States Patent

Stengl

[11] Patent Number: 5,869,838
[45] Date of Patent: Feb. 9, 1999

[54] FIELD COMPOSABLE ELECTROSTATIC LENS SYSTEM

[75] Inventor: Gerhard Stengl, Wernberg, Austria

[73] Assignee: Advanced Lithography Group, Columbia, Md.

[21] Appl. No.: 712,417

[22] Filed: Sep. 11, 1996

[51] Int. Cl.[6] .................................................. H01J 37/12
[52] U.S. Cl. ....................................................... 250/396 R
[58] Field of Search ......................................... 250/396 R

[56] References Cited

U.S. PATENT DOCUMENTS

| 4,859,857 | 8/1989 | Stengl et al. | 250/492.3 |
|---|---|---|---|
| 4,870,283 | 9/1989 | Taya | 250/396 R |
| 4,963,748 | 10/1990 | Szilagyi | 250/396 R |
| 5,444,256 | 8/1995 | Nagai et al. | 250/396 R |

FOREIGN PATENT DOCUMENTS

WO 95/19637  7/1995  WIPO.

OTHER PUBLICATIONS

A. Chalupka et al., "Novel Electrostatic Column for Ion Projection Lithography," *J. Vac. Sci. Technol., B* vol. 12, No. 6, Nov/Dec 1994, pp. 3513–3517.

W. Finkelstein et al., "Part 1: Overcoming Perceptions; Ion Beaming Lithography—A paradigm Shift in Technology," *Semiconductor International,* May 1995, pp. 55,56 & 58.

W. Finkelstein et al., "Part 2: The Status; Ion Beam Lithography—A Paradigm Shift in Technology," *Semiconductor International,* Jun. 1995, pp. 107, 108, 110 and 111.

M.G.R. Thomas et al., "Lens and Deflector Design for Microcolumns," *J. Vac. Sci. Technol. B,* vo. 13 No. 6, Nov/Dec 1995, pp. 2445–2449.

*Primary Examiner*—Jack I. Berman
*Attorney, Agent, or Firm*—Sterne Kessler Goldstein & Fox

[57] ABSTRACT

An electrostatic lens system consisting of several electrodes and a novel method of making same. The invention relates to a lithography apparatus that includes a field composable lens where at least one lens electrode has a novel structure, said structure comprising an outer support structure, an insulating intermediate part and a conductive inner part composed of a number of segment-like subelectrodes that can be individually powered, if necessary, slightly differently to produce desired individual electrostatic subfields to be superimposed to the lens field. With the field composable lens design, it has been successfully demonstrated that a number of shape and alignment errors of lens components can be corrected by supplying slightly different voltages to individual subelectrodes, thus optimizing the overall lens performance (in view of its optical properties). The lens components may be manufactured on less expensive and readily available conventional precision machinery rather than expensive and rarely available high precision equipment.

19 Claims, 6 Drawing Sheets

FIG.5b
MAX. DISTORTION AT WAFER PLANE
5 nm

FIG.5a
MAX. DISTORTION AT WAFER PLANE
420 nm

FIELD COMPOSABLE ELECTROSTATIC LENS SYSTEM

BACKGROUND OF THE INVENTION

1. Field of the Invention

The invention relates to an electrostatic lens system consisting of several electrodes and a method of making the same. More particularly, the underlying invention relates to a lithography apparatus where such a lens system is used in a highly advantageous manner.

2. Related Art

Electrostatic lenses consisting of electrodes at different potentials have to meet certain criteria in view of the roundness and surface quality as well as the relative adjustment of the lens electrodes with respect to each other in order to achieve the required image qualities. In a system having more than one lens, the relative adjustment of the lenses with respect to each other is of great importance too. Further, positioning errors of the particle source and its extracting system may deteriorate the image quality.

In a charged particle lithography system, charged particles originating from a suitable source are transmitted through a mask defining a specific pattern in order to transfer this pattern, with or without a scaling factor, to a substrate. The imaging as well as the mask illuminating system may be composed of one or several electrostatic lenses. For many purposes, it is important that the shape of the pattern on the substrate is to a high extent conformal to the pattern on the mask, i.e., to create an electrostatic column having negligible deviation of pattern placement from the desired position. Usually, these deviations can be tolerated only to fractions of the smallest line width to be printed, e.g., for 180 nm patterns the tolerance is ≈20 nm.

For the purpose of making and assembling such a lithography apparatus, the above mentioned tolerances are strictly confined, for example for electrodes with a diameter of 1 m or more to a roundness of better than ±2 $\mu$m for each lens electrode, to positioning accuracy of ±2 m and to 30 $\mu$rad maximum tilt. World wide, such a making and assembling precision is met by only very few sites. Thus, the state of the art manufacturing costs are likely to render apparatus of this type unfavorable for industrial application.

For industrial semiconductor fabrication, it is advantageous to use the so-called "Mix and Match" mode, in which the less demanding parts with regard to line width and resolution of the chip are made by well-established optical lithography, whereas the layers with high performance requirements are produced by, e.g., ion beam lithography, in particular projection lithography. In this "Mix and Match" mode, it is necessary to adapt the shape of the pattern imaged by ion projection lithography to the shape achieved by optical lithography. That means that a tool is needed by which the imaging parameters may be varied and controlled.

In U.S. Pat. No. 4,859,857, which is incorporated by reference, a projection lithography apparatus is disclosed, having a multipole correction element, which is located adjacent to the mask in order to control the shape of the pattern transferred to the substrate. Said correction element comprises electrostatic and/or magnetic multipoles, i.e., a number of, e.g., cylindrical rods and current wires forming magnetic poles arranged around the particle beam. This arrangement is capable of successfully correcting misplacements in the mask pattern which may arise, e.g., from local distortions of the mask. The same arrangement can be used to adjust the image distortion at the substrate level to achieve overlay in a mix and match mode.

In the article entitled "Lens and Deflector Design for Microcolumns," M. G. R. Thompson and T. H. P. Chang in *Journal of Vacuum Science Technologies*, Vol. B13, No. 6:2445–2449 (November/December 1995), discuss the problem of alignment tolerances in proposed microcolumn systems using electrostatic lenses and deflectors for focusing and scanning electron probes. In optimizing a microcolumn system of this type, the article proposes an integration of the scanning deflectors into the lens by segmenting one or more of the lens electrodes and superimposing the deflection voltages to the lens electrode voltage in order to achieve a better deflection performance.

What is needed is a novel concept for making electrostatic lenses that are capable of relaxing the currently defined tolerance constraints. In this context, it is highly desirable to manufacture and assemble lens components by affordable precision machinery widely available in the art. Further, a feature of the present invention is to provide a lithography apparatus making use of the novel lens concept in order to enable manufacturing, assembling and disassembling of lens columns at a readily affordable cost.

SUMMARY OF THE INVENTION

The present invention proposes a so-called field composable lens where at least one lens electrode has a novel structure, said structure comprising an outer support structure, an insulating intermediate part and a conductive inner part composed of a number of segment-like subelectrodes that can be individually powered, if necessary, slightly differently, to produce desired individual electrostatic subfields to be superimposed to the lens field.

With this new field composable lens design, it has been successfully demonstrated that a number of shape and alignment errors of lens components can be corrected by supplying slightly different voltages to individual subelectrodes, thus optimizing the overall lens performance (in view of its optical properties). Therefore, lens components may be manufactured on less expensive and readily available conventional precision machinery rather than expensive and rarely available high precision equipment.

Further, a lithography apparatus making use of the novel field composable lens design, will additionally be capable of successfully correcting alignment errors of one lens with respect to another by optimizing the overall performance of the imaging system (e.g., in view of its distortion). Therefore, the assembly of a lens column may be performed under relaxed tolerance limits, thus making use of less expensive conventional precision fitting mechanisms rather than using expensive assembly tools for lens electrode adjustments. This will further facilitate disassembling and reassembling the lens column in a highly desirable manner. Also, a lithography apparatus making use of the novel field composable lens will be much less sensitive to external influences like temperature effects or mechanical shocks.

Further, the new lens design may be successfully used to correct errors relating to the mask design and mask positioning in a lithography apparatus.

In general, tolerances of the lens components as well as tolerances with respect to lens assembly, column assembly and mask design and positioning will be significantly relaxed in that conventional precision apparatuses may be used in manufacturing and assembling lenses and lithography apparatuses equipped with such lenses.

The invention further favors mixed mode usage of fab line equipment. In fact, the lens design is capable of re-simulating known deviations from the pattern design of any other fab line equipment, for example, of optical wafer steppers or masks previously used in the manufacturing process. Furthermore, any particle beam lithography apparatus may be easily tuned to produce identical exposure results of any other (previously used) particle beam lithography apparatus. In consequence, all lithography apparatuses having the novel lens design may be interchangeably used in the fab process.

In a preferred embodiment of the present invention, the field composable lens comprises subelectrodes having an identical sector shape. A subelectrode may either be produced by a film of a predefined size covering a predefined portion of an insulating intermediate layer or may alternatively be provided by a pre-shaped electrode member that is rigidly affixed to the support structure. For the latter, the electrode member and the support structure may be advantageously connected by a snug fit. Preferably, we can use carbon or aluminum to make electrode members or electrode films for the field composable lens.

Another feature of the present invention is to provide charged particle optical systems with electrostatic lenses whose imaging parameters in terms of distortion and magnification may be controlled and varied within certain limits.

The foregoing and other features and advantages of the present invention will become apparent from the following description of a preferred embodiment.

DETAILED DESCRIPTION OF THE PREFERRED EMBODIMENTS

Figure 1:
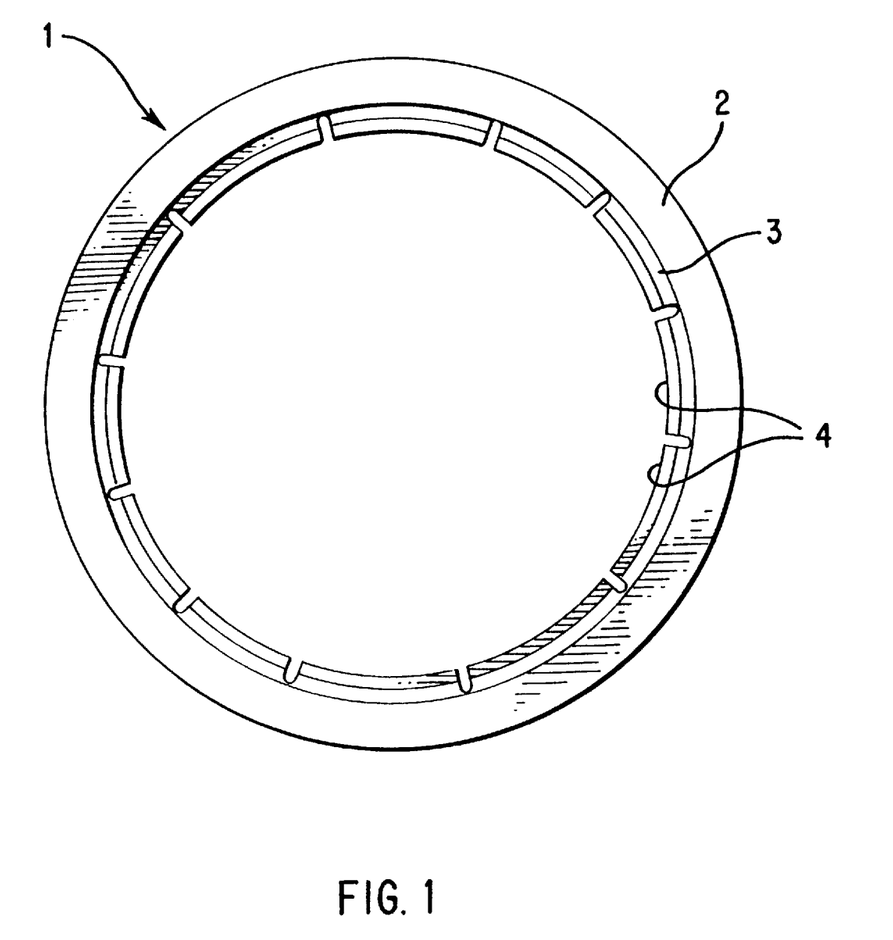
FIG. 1 is a schematic of the principal concept of the field composable lens.

Referring now to FIG. 1, the field composable lens concept according to the present invention is shown schematically in a cross-section of a lens electrode, generally referenced by numeral 1. The lens electrode 1 comprises a support structure of substantially annular cross-section 2, an insulating intermediate layer 3, and an inner electrode surface layer that is formed by twelve identically shaped subelectrodes 4 of uniform thickness isolated from each other by a predefined space.

For the purpose of appreciating the present invention, it shall be understood that any number of electrodes larger than 6 may be used. In general, the performance of the field composable lens will increase with the increasing number of electrodes.

Each subelectrode 4 of the inner surface layer is independently connected to a power supply means (not shown), which is capable of generating a predefined electrostatic subfield at each subelectrode, where the sum of all twelve predefined subfields generates the required field of the lens electrode 1.

Figure 2:
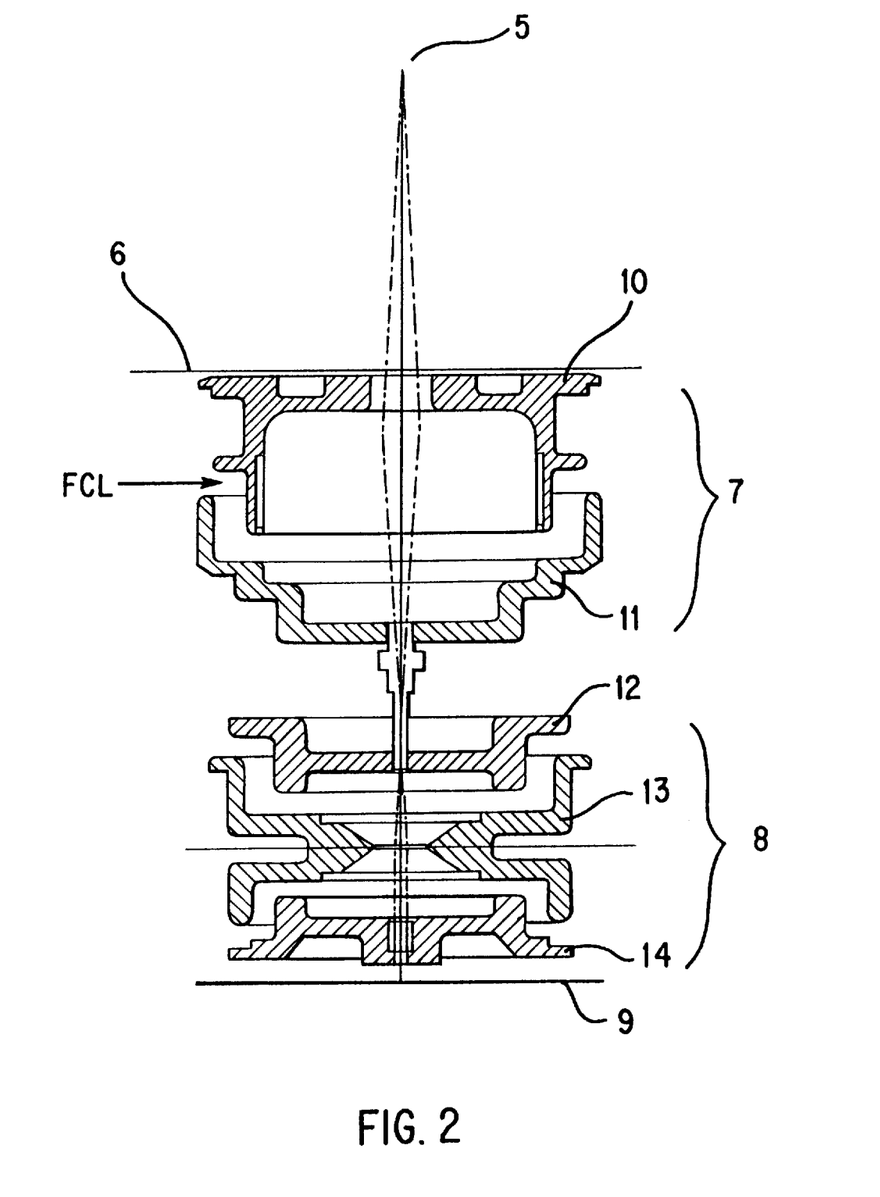
FIG. 2 schematically illustrates a projection lithography apparatus having a field composable lens.

With reference to FIG. 2, there is shown an embodiment of a field composable lens according to the present invention implemented in a lens assembly for a projection lithography apparatus using electrically charged particles to expose a mask pattern to a substrate in a predefined (reduced) size (A. Chalupka et al., "Novel Electrostatic Column for Ion Projection Lithography," *J Vac. Sci. Technol.*, Vol. B12, No. 6:3513–3517 (November/December 1994)). The lithography apparatus is currently manufactured under the ALG-1000 project (W. Finkelstein and A. A. Mondelli, "Ion Beam Lithography—A Paradigm Shift in Technology," *Semiconductor International*, 56 and 58 (May 1995) and 107, 108 and 110 (June 1996)). Said apparatus comprising a source of charged particles 5, a mask 6, a gap lens 7 for forming a crossover and an asymmetrical Einzel lens 8 forming an image of the mask pattern at the wafer plane 9. The principal design of such a projection apparatus is disclosed in the publication of the International Application WO 95/19637. For the purpose of the following description, we will use the abbreviation FCL to designate a field composable lens or to refer to the field composable lens design.

In the embodiment of FIG. 2, the field composable lens (FCL) design is implemented in the lens electrode 10 adjacent to the mask 6, whereas the field electrode 11 of the gap lens 7 is composed in a conventional and known manner.

However, in other embodiments of the present invention, any other lens electrode may be used to implement the FCL design. In addition, and according to the present invention, two or more lens electrodes of any lens system known to a person skilled in the art may be equipped with a FCL design.

The projection Einzel lens 8 is constructed in a conventional known manner comprising a top electrode 12, a center electrode 13 and a bottom electrode 14. The Einzel lens 8 of the embodiment according to FIG. 2 does not comprise an implementation of the FCL design.

Figure 6:
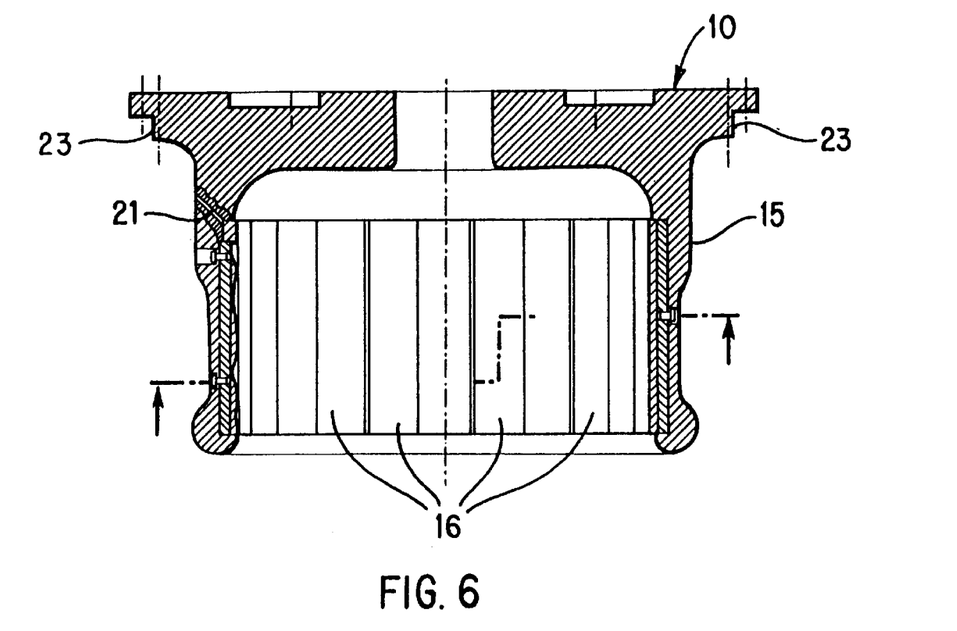
FIG. 6 illustrates a vertical cross-section of the gap lens electrode of FIG. 2.
Figure 7:
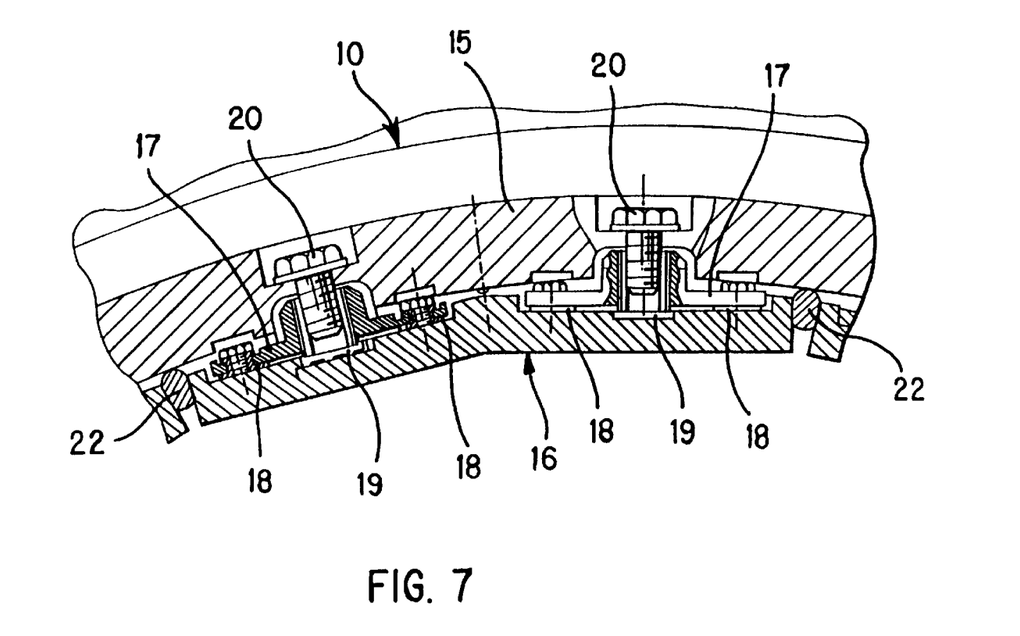
FIG. 7 illustrates a detail of a horizontal cross-section of the electrode of FIG. 6.

As shown in FIG. 6 and FIG. 7, the gap lens (FCL) electrode shown as element 10 in FIG. 2 has a cylindrical lower portion 15 where the FCL concept is implemented according to the schematic of FIG. 1 by providing a number of subelectrodes 16 at the inner electrode surface.

Figure 3A:
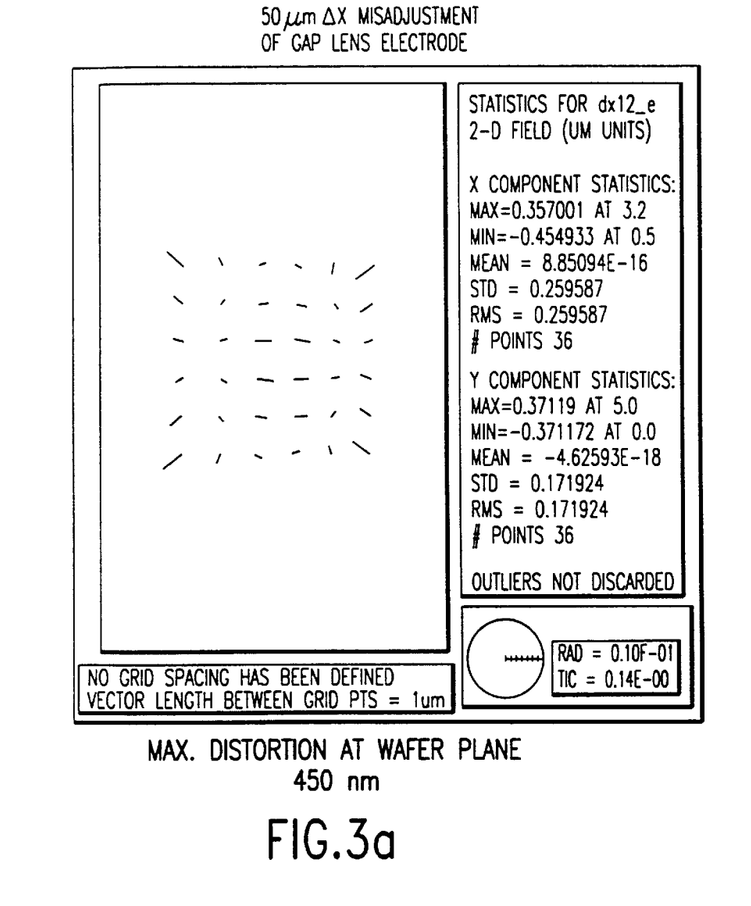
FIGS. 3a, 3b illustrate a test calculation for compensating off axis misadjustment of the gap lens electrode of FIG. 2.
Figure 3B:
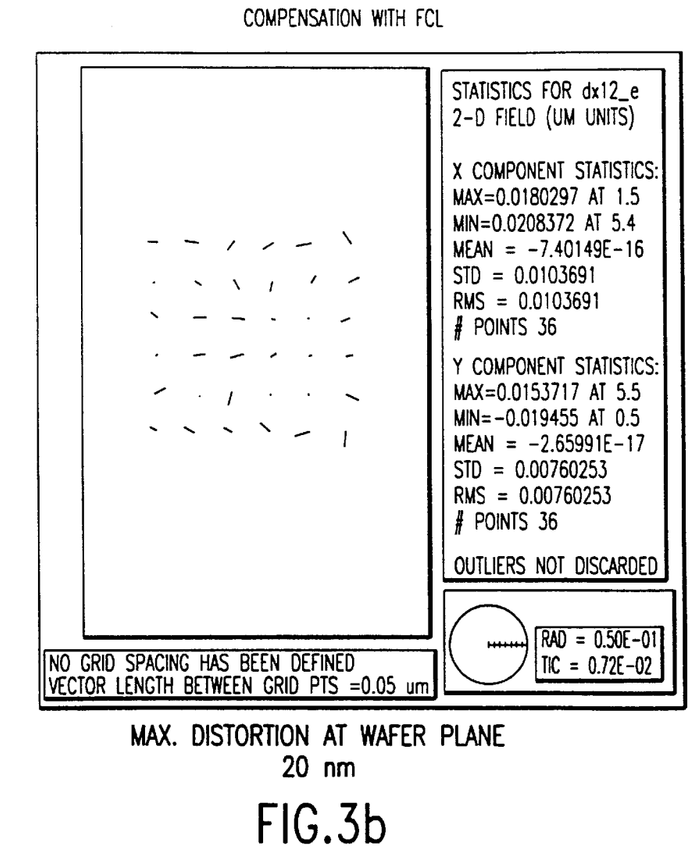
Figure 4A:
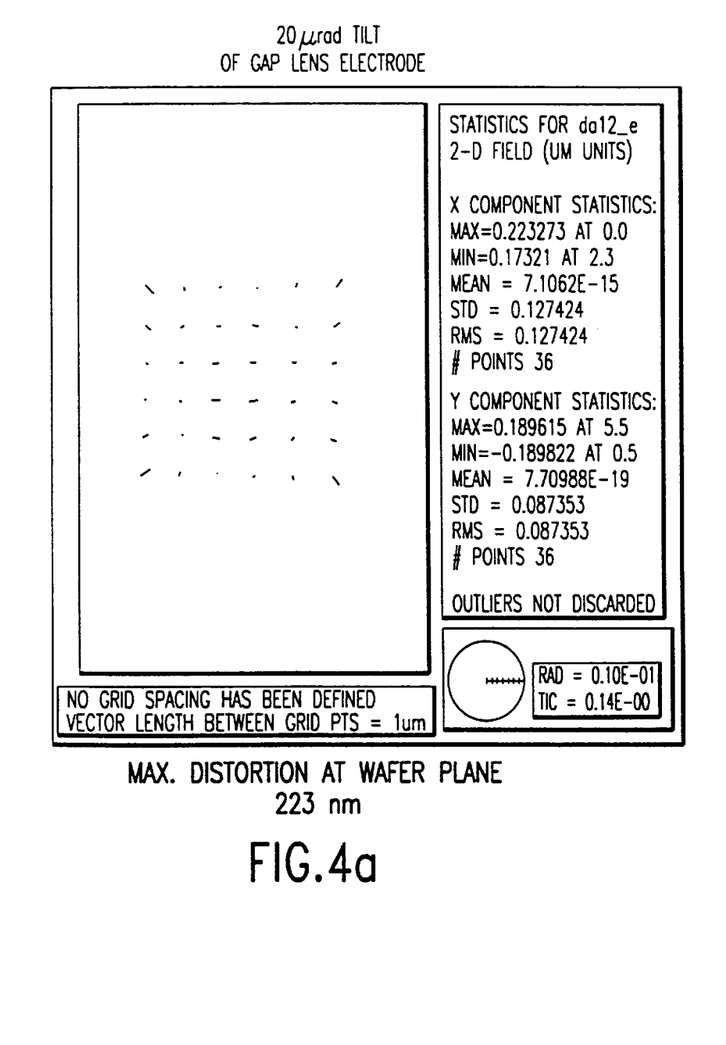
FIGS. 4a, 4b illustrate a test calculation for compensating a tilt misadjustment of the gap lens electrode of FIG. 2.
Figure 4B:
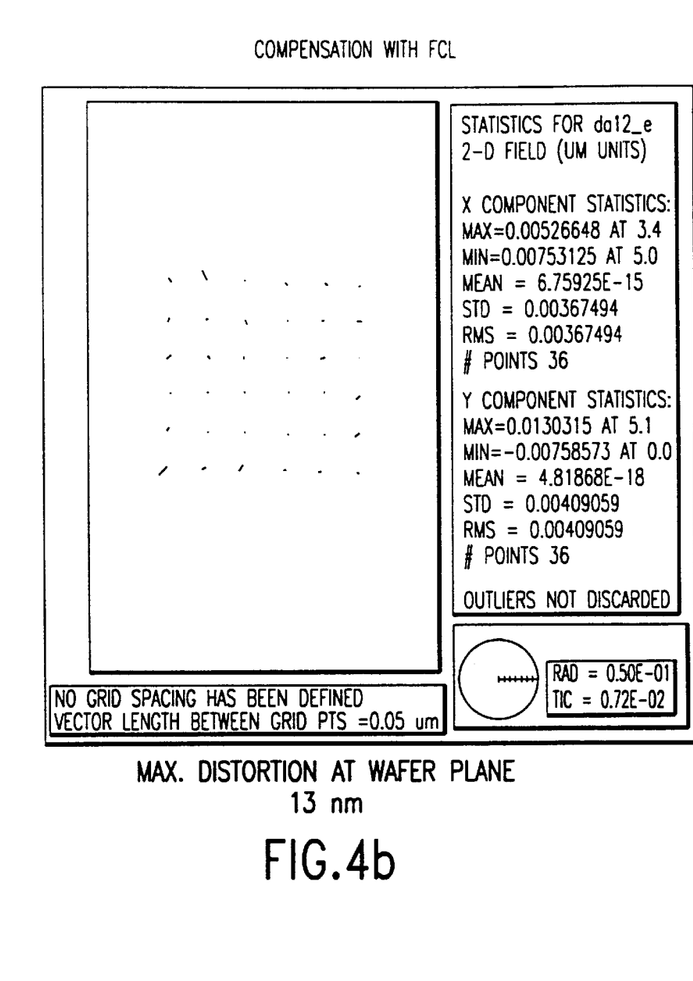
Figure 5A:
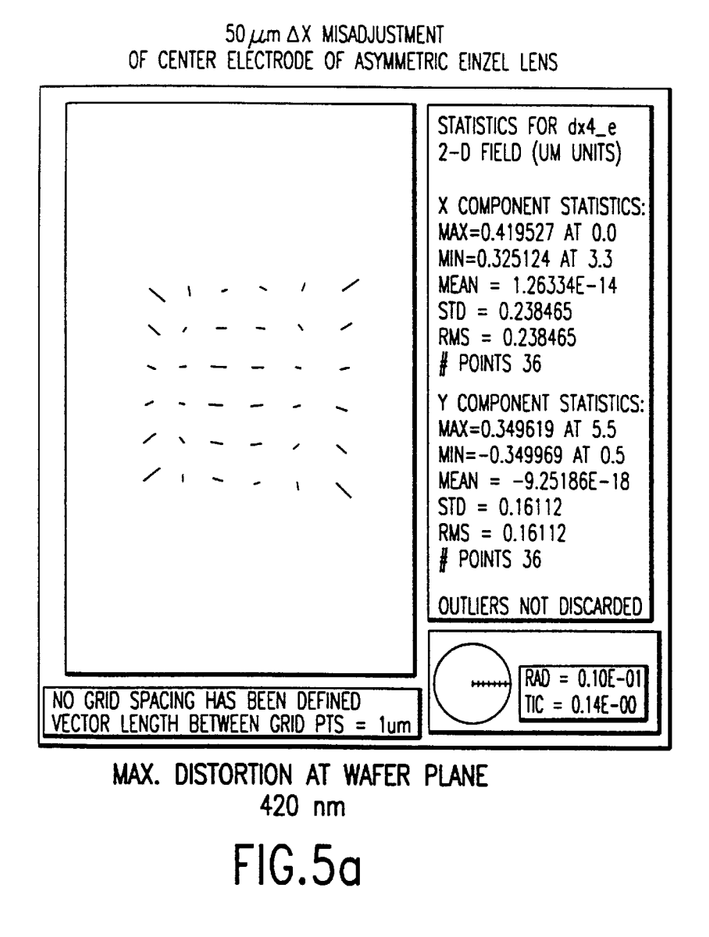
FIGS. 5a, 5b illustrate a test calculation for compensating a misadjustment of the center electrode of the asymmetric Einzel lens of FIG. 2.
Figure 5B:
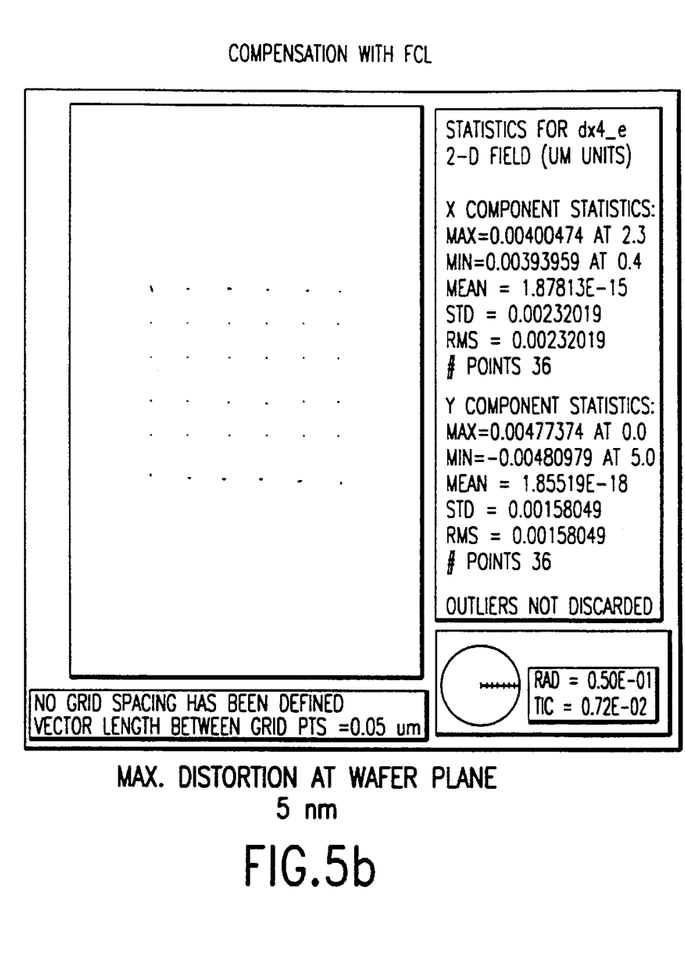

For demonstrating the error correction capability of the FCL, we have calculated the image distortion, namely for off axis misadjustment of the field lens electrode 11 of FIG. 2, for tilt of the same electrode and for off axis misadjustment of the Einzel lens center electrode 13 of FIG. 2. The calculations are based on a 20×20 mm image size at the wafer plane. Further, we have calculated the maximum image distortion when optimizing the individual power supplies of each of the twelve subelectrodes. The results of these computations are shown in FIGS. 3a, 3b (off axis misadjustment of the center electrode), FIGS. 4a, 4b (tilt of the field electrode 11) and FIGS. 5a, 5b (off axis misadjustment of the center electrode 13). The image distortion without FCL is shown in FIGS. 3a, 4a and 5a, whereas the image distortion using FCL is shown in FIGS. 3b, 4b and 5b. Note that in the figures, the displacement vectors for the image points have a different scale, namely, in FIGS. 3a, 4a and 5a, the distance between two adjacent image points for the purpose of representing the distortion is equivalent to 1 micron, whereas in FIGS. 3b, 4b and 5b, the same distance is equivalent to 0.05 micron. In the following table we have compiled the results of the above-mentioned computations.

| misadjustment type value | max. image distortion at wafer surface without FCL | max. image distortion at wafer surface with FCL |
|---|---|---|
| gap lens electrode 11 $\Delta X = 50\ \mu m$ | 450 nm (FIG. 3a) | 20 nm (FIG. 3b) |
| gap lens electrode 11 tilt = 20 $\mu rad$ | 223 nm (FIG. 4a) | 13 nm (FIG. 4b) |
| center electrode 13 $\Delta X = 50\ \mu m$ | 420 nm (FIG. 5a) | 5 nm (FIG. 5b) |

For a person skilled in the art, it will be apparent that further image distortion computations may be performed to fully appreciate the error correction capabilities of the FCL concept, for example, misadjustment simulations of the gap lens 7 with respect to the Einzel lens 8 or shape and surface errors of each lens electrode or errors associated with the mask pattern.

Referring now to FIGS. 6 and 7, the gap lens (FCL) electrode 10 of FIG. 2 is shown in greater detail. It is shown in an intermediate assembly state, before the final shaping of the inner electrode surface takes place. The lens electrode 10 has an aluminum support structure 15 having a substantial cylindrical lower portion which is used to implement the FCL design according to the present invention. The FCL portion according the embodiment of FIGS. 6 and 7 comprises twelve identically-shaped, electrically-conductive subelectrodes 16 comprising, at the state of assembly shown in FIGS. 6 and 7, planar plates conformed to be subsequently shaped into a cylindrical surface indicated in FIG. 7 in broken lines. Each subelectrode 16 is electrically isolated from its adjacent subelectrodes and from the support structure 15 by space gaps and/or insulating elements. For making the electrode plates 16, preferably aluminum or carbon is used.

Each electrode plate 16 is rigidly mounted to the support structure by three mounting members 17 arranged in a triangular pattern, said plate-like mounting members 17 including positioning means to accurately position the electrode plates 16.

Each mounting member 17 is electrically isolated from the corresponding electrode plate 16 by electrically insulating spacer elements 18 interposed between the mounting members 17 and the electrode plate 16. Each mounting member 17 is bolted to the support structure 15 by a precision snug fit in order to accurately position the electrode plates 16. The snug fit according to the embodiment of FIGS. 6 and 7 comprises a cylindrical opening in each mounting plate 17 to snugly accommodate a threaded socket 19 for the bolt 20, which snugly fits through a corresponding cylindrical opening of the support structure 15.

In FIG. 6 there is shown a channel 21 through the side wall of the support structure 15 at the upper portion of the FCL portion of the lens electrode. The channel 21 is used to connect the corresponding electrode plate 16 to a suitable power supply means. In the FCL, each electrode plate 16 is independently connected to the power supply means and therefore, twelve individual channels 21 are provided in the support structure 15 of FIG. 6.

Before being assembled to an electrostatic lens, the electrode 15, according to the embodiment of FIGS. 6 and 7, will undergo a final finishing procedure for shaping the cylindrical inner electrode surface according to the broken lines of FIG. 7. Said shaping is done by a precision rotating tool such as a turning lathe. For protecting the space gap insulation between the electrode plates 16 and the support structure 15, the space gaps between the electrode plates 16 will be sealed with rubber seals 22 during the step of shaping. After shaping the electrode surface, said rubber seals 22 will be removed.

In comparison to conventional lens making techniques, the precision required for tooling the FCLs is substantially relaxed in that conventional tooling machinery may be used rather than expensive high precision equipment, thus reducing the manufacturing cost of the lenses.

Furthermore, due to the significantly relaxed tolerance requirements, the assembly of the lens electrodes 10, 11 to build the gap lens 7 may be achieved by simple snug fit connections indicated at 23 in FIG. 6 rather than the expensive rotating table micro adjustment procedures which have to be used to meet the requirements for conventional lenses. Further, said simple snug fit concept may be used to adjust lenses 7, 8 with respect to each other.

While the invention has been particularly described with respect to one preferred embodiment thereof, it will be recognized by those skilled in the art that a number of modifications may be made without departing from the spirit and scope of the invention. In particular, the scope of the invention is not limited to a lithography apparatus, but in intended to include any lens or lens electrode design that requires a precise shaping and positioning to achieve accurate image quality. Furthermore, the lens design according to the embodiment described may be varied in a number of ways. For example, when using mounting members, said members may be made of insulating material such that no insulating spacers may be required. In an alternative embodiment, the insulating layer may be an insulating film layer connected to (or deposited on) the inner surface of the support structure rather than a space gap between the support structure and the electrode plates. Furthermore, the electrode layer may be embodied in an electrically conductive film layer deposited on an insulating layer and subdivided into predefined electrode surfaces. In this case, a subsequent shaping of the electrode surface may not be necessary. Rather than that, the support structure or the insulating layer may be subject to rotational precision shaping.

The number of subelectrode surfaces used in a FCL may be chosen at any given number larger than 6 according to the field compositional needs. In any electrostatic lens, one or more lens electrodes may be fitted with the FCL feature. Further, a single electrode may comprise a number of annular FCL sections electrically isolated from each other for potentially expanding the field composing possibilities of a lens.

What is claimed is:

1. An electrostatic lens system for focusing charged particle beams, said electrostatic lens system having at least two lens electrodes, wherein at least one of said lens electrodes having a circular inner electrode surface comprises:

an outer support structure;

an electrically conductive inner part comprising a number of subelectrodes electrically isolated from each other which collectively defines the circular inner electrode surface, each of said subelectrodes covering a predefined angular portion of the inner electrode surface; and an insulating intermediate part interposed between said outer support structure and said electrically conductive inner part, each subelectrode being independently connected to a power supply means for generating a predefined subfield of an electrostatic lens field, wherein each subelectrode is rigidly connected to said outer support structure by connecting means, said connecting means including positioning means for accurately positioning each of said subelectrodes.

2. The electrostatic lens system defined in claim 1, wherein said inner part comprises subelectrodes having identically shaped inner surfaces forming a sector of a cylindrical surface, and said number of subelectrodes are regularly distributed within said cylindrical inner surface.

3. The electrostatic lens system defined in claim 1, wherein said connecting means comprises, for each subelectrode, at least three mounting members rigidly affixed to their corresponding subelectrode, said positioning means comprising a support surface at each mounting member and a corresponding counter support surface at said outer support structure, said support surface of each mounting member snugly fitting said corresponding counter support surface of said outer support structure.

4. The electrostatic lens system defined in claim 3, wherein said mounting members are made of insulating material.

5. The electrostatic lens system defined in claim 1, wherein said power supply means is connected to each subelectrode by means of a channel through said outer support structure.

6. The electrostatic lens system defined in claim 1, wherein said subelectrodes are composed of a pre-shaped carbon member.

7. The electrostatic lens system defined in claim 1, wherein said subelectrodes are composed of a pre-shaped member made from metal material.

8. The electrostatic lens system defined in claim 1, wherein said subelectrodes are composed a carbon film of a predefined size.

9. The electrostatic lens system defined in claim 1, wherein said subelectrodes are composed of a metal layer of a predefined size.

10. The electrostatic lens system defined in claim 1, wherein said number of subelectrodes is twelve.

11. The electrostatic lens system defined in claim 1, wherein said insulating intermediate part is an insulating film connected to an inner surface of said outer support structure.

12. A method of making an electrostatic lens having at least two radially symmetric lens electrodes with a circular inner electrode surface, comprising the steps of:

(a) providing an outer support structure for at least one of the lens electrodes;

(b) providing an electrically insulating intermediate part adjacent to the inner surface of the outer support structure;

(c) providing an electrically conductive inner part defining a number of electrically conductive subelectrodes isolated from each other which collectively defines the circular inner electrode surface, and rigidly mounting and adjusting the subelectrodes to the support structure, each of the subelectrodes covering a predefined angular portion of the circular inner electrode surface and (d) providing an electrical conduction means from each of the subelectrodes to a power supply means for generating a predefined subfield of the electrostatic lens field.

13. The method according to claim 12, wherein step (c) further comprises the step of:

accurately positioning each of the subelectrodes.

14. The method according to claim 12, wherein, after mounting the subelectrodes to the support structure, said method further comprises the step of reshaping the identically shaped subelectrodes using a rotational tool to obtain an inner electrode surface with a substantially circular cross-section.

15. The method according to claim 12, wherein at least two annular lens electrodes are mounted and adjusted with respect to each other by means of predefined precise snug fit means, wherein any remaining misalignment of the lens electrodes with respect to each other is compensated by generating individual subfields at the subelectrodes of at least one of the lens electrodes by the power supply means.

16. A lithography apparatus using charged particles to expose a predefined mask pattern to a substrate, the apparatus comprising a source for emitting charged particles and means for shaping a particle beam, the beam shaping means comprising at least one electrostatic lens having at least two lens electrodes, at least one of the lens electrodes having a circular inner electrode surface comprising:

an outer support structure with substantially annular cross-section;

an electrically conductive inner part comprising a number of subelectrodes electrically isolated from each other and said support structure, said number of subelectrodes collectively defining the circular inner electrode surface, each of said subelectrodes covering a predefined angular portion of the circular inner electrode surface, wherein each of said subelectrodes is rigidly connected to said outer support structure by connecting means, said connecting means including positioning means for accurately positioning each of said subelectrodes; and an insulating intermediate part interposed between said outer annular support structure and said electrically conductive inner surface part, each subelectrode being independently connected to a power supply means for generating a predefined subfield of the electrostatic lens field to compose an image of the mask pattern with minimum or pre-defined distortion at the substrate by generating individual subfields at each of said subelectrodes and thereby composing an electrode field.

17. The lithography apparatus defined in claim 16, wherein said connecting means comprises, for each subelectrode, at least three mounting members rigidly affixed to their corresponding subelectrode, said positioning means comprising a support surface at each mounting member and a corresponding counter support surface at said outer support structure, said support surface of each mounting member snugly fitting said corresponding counter support surface of said outer support structure.

18. A field composable lens having a substantially circular inner electrode surface, comprising:

an outer support structure;

an electrically conductive inner part comprising a number of subelectrodes electrically isolated from each other which collectively defines the circular inner electrode surface, each of said subelectrodes covering a predefined angular portion of the inner electrode surface; and an insulating intermediate part interposed between said outer support structure and said electrically conductive inner part, each subelectrode being independently connected to a power supply means for generating a predefined subfield of an electrostatic lens field, wherein each of said subelectrodes is rigidly connected to the outer support structure by connecting means, said connecting means including positioning means for accurately positioning each of said subelectrodes.

19. The field composable lens defined in claim 18, wherein said connecting means comprises, for each subelectrode, at least three mounting members rigidly affixed to their corresponding subelectrode, said positioning means comprising a support surface at each mounting member and a corresponding counter support surface at said outer support structure, said support surface of each mounting member snugly fitting said corresponding counter support surface of said outer support structure.

* * * * *